(12) United States Patent
Yoshitomi et al.

(10) Patent No.: US 7,053,402 B2
(45) Date of Patent: May 30, 2006

(54) LIGHT EMITTING ELEMENT

(75) Inventors: Shuhei Yoshitomi, Kanagawa (JP);
Junichiro Sakata, Kanagawa (JP);
Masahiro Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/766,170

(22) Filed: Jan. 27, 2004

(65) Prior Publication Data

US 2005/0056830 A1    Mar. 17, 2005

(30) Foreign Application Priority Data

Jan. 28, 2003  (JP)  ............... 2003-019545

(51) Int. Cl.
*H01L 51/00* (2006.01)
(52) U.S. Cl. .......................... 257/40; 257/13
(58) Field of Classification Search ............. 257/40, 257/13, 22

See application file for complete search history.

(56) References Cited

U.S. PATENT DOCUMENTS

| | | | |
|---|---|---|---|
| 5,552,547 A * | 9/1996 | Shi | 546/7 |
| 5,834,130 A | 11/1998 | Kido | 428/690 |
| 5,869,199 A | 2/1999 | Kido | 428/690 |
| 5,989,737 A | 11/1999 | Xie et al. | 428/690 |
| 6,603,140 B1 | 8/2003 | Kobori et al. | 257/40 |
| 2002/0038867 A1 | 4/2002 | Kobori et al. | 257/40 |
| 2002/0113546 A1 | 8/2002 | Seo et al. | 313/504 |

FOREIGN PATENT DOCUMENTS

| | | |
|---|---|---|
| EP | 0 647 694 A1 | 4/1995 |
| EP | 0 712 916 A1 | 5/1996 |
| JP | 07-041759 | 2/1995 |
| JP | 10-255985 | 9/1998 |
| JP | 2000-243574 | 9/2000 |
| JP | 2002-324673 | 11/2002 |
| WO | WO 98/08360 | 2/1998 |

OTHER PUBLICATIONS

Aziz, H. et al, "Study of Organic Light Emitting Devices with a 5, 6, 11, 12-Tetraphenylnaphthacene (Rubrene)-Doped Hole Transport Layer," Applied Physics Letters, vol. 80, No. 12, pp. 2180-2182, Mar. 25, (2002).
International Search Report for application No. PCT/JP2004/000455, mailed Apr. 13, 2004 (In Japanese).

(Continued)

*Primary Examiner*—David Nelms
*Assistant Examiner*—Thinh T Nguyen
(74) *Attorney, Agent, or Firm*—Cook, Alex, McFarron, Manzo, Cummings & Mehler, Ltd.

(57) ABSTRACT

In order to provide a light emitting device which consistently emits light at the time of continuous driving in addition to obtain light emission having a high color purity in each of red, green and blue, a light emitting element according to the present invention, in which an organic compound film comprising a hole transporting material, an electron transporting material, a first impurity (first doping material), and a second impurity (second doping material) is provided between an anode and a cathode, is characterized in that the organic compound film is laminated with a first mixed region comprising the hole transporting material and the first impurity, a hole transporting region comprising the hole transporting material, a second mixed region comprising the electron transporting material and the second impurity, and an electron transporting region comprising the electron transporting material in order from the side of the anode.

5 Claims, 8 Drawing Sheets

OTHER PUBLICATIONS

Opinion to International Search Report for application No. PCT/JP2004/000455, mailed Apr. 13, 2004 (with partial English translation).

Tang, C.W. et al, "Organic Electroluminescent Diodes," Appl. Phys. Lett., vol. 51, No. 12, pp. 913-915, Spetember 21, (1987).

Adachi, C. et al, "Electroluminescence in Organic Films with Three-Layer Structure," Japanese Journal of Applied Physics, vol. 27, No. 2, pp. L269-L271, Feb. (1988).

Tang, C.W. et al, "Electroluminescence of Doped Organic Thin Films," J. Appl. Phys., vol. 65, No. 9, pp. 3610-3616, May 1, (1989).

* cited by examiner

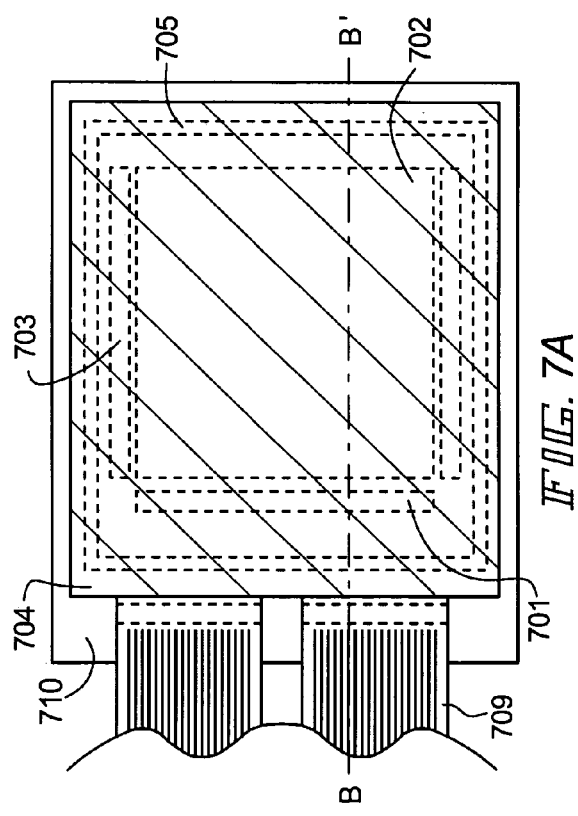
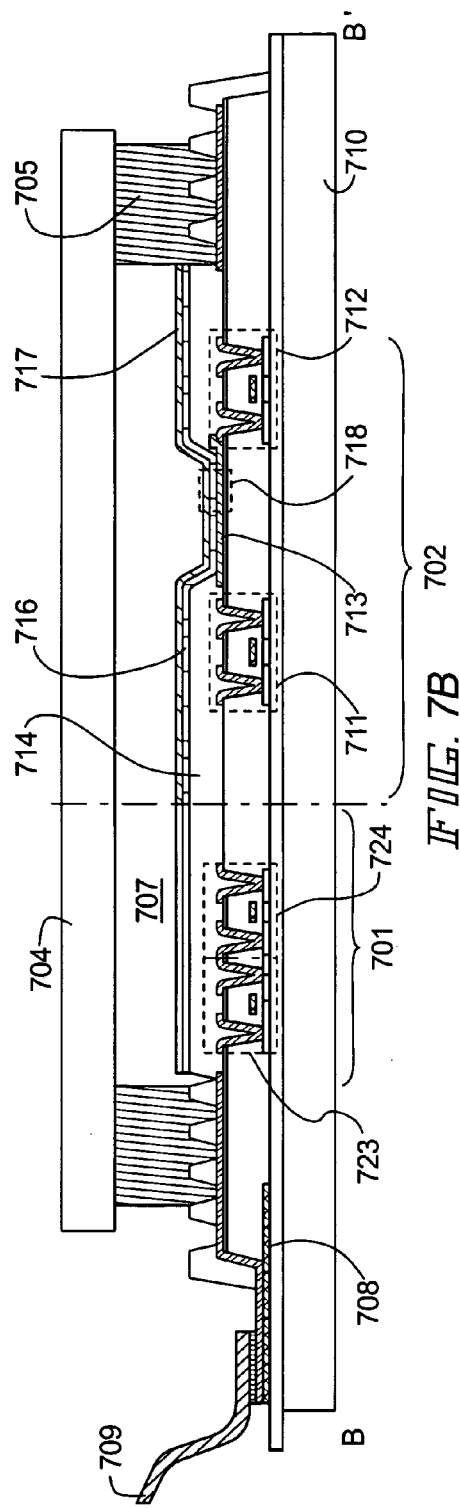

LIGHT EMITTING ELEMENT

TECHNICAL FIELD

The present invention relates to an organic light emitting element comprising an anode, a cathode and a film comprising an organic compound (hereinafter, referred to also as "organic compound film") which can obtain light emission by being applied with an electric field and a method for manufacturing the light emitting element.

BACKGROUND OF THE INVENTION

An organic light emitting element is an element which emits light by being applied with an electric field. A light emitting mechanism is said to be that an organic compound film is interposed between electrodes, voltage is applied to them, an electron injected from a cathode and a hole injected from an anode are recombined in the organic compound film to form a molecule in an excited state (hereinafter, referred to also as "molecular exciton"), and then, light is emitted by allowing energy to be discharged when the molecular exciton returns to a base state.

As for the type of the molecular exciton which is formed by the organic compound, those in a singlet excitation state and a triplet excitation state are considered to be possible. Herein, a case in which any one of them contributes to light emission is included.

In such organic light emitting element as described above, ordinarily, the organic compound film is formed with a thickness as low as less than 1 μm. Further, since the organic light emitting element is an element of a self-light emitting type in which the organic compound film itself emits light, the organic light emitting element does not require a backlight which has been used in an ordinary liquid crystal display. Therefore, there is a large advantage in that the organic light emitting element can be manufactured to be extremely thin and light-weight.

Further, for example, in the organic compound film of approximately from 100 to 200 nm, a period between the time a carrier is injected and the time it is recombined is only several tens of nanoseconds when a transportation rate of a carrier is taken into consideration so that light is emitted in the order of microseconds even including a process of from such recombination of the carrier to light emission. Therefore, an extremely fast response speed is also one of characteristics.

Further, since the organic light emitting element is a light emitting element of a carrier injection type, it is capable of being driven by a direct current voltage and hardly generates noises. As for the driving voltage, firstly thickness of the organic compound film is allowed to be of an ultra thin uniform film of about 100 nm, and then, an electrode material in which a carrier injection barrier is allowed to be small against the organic compound film is selected and, further, a heterostructure (double layer structure) is introduced and, as a result, such sufficient brightness as 100 cd/m$^2$ is attained at 5.5 V (for example, refer to Non-Patent Document 1).

(Non-Patent Document 1): C. W. Tang et al., Applied Physics, Letters, 1987, Vol. 51, No. 12, pp. 913 to 915.

From these characteristics, namely, thin light-weight, a rapid response property, direct current low voltage driving and the like, the organic light emitting element has been paid attention as a flat panel display element of a next generation. Further, since it is a self-light emitting type and has a wide viewing angle, it is comparatively favorable in visibility and is considered effective as an element for use in a display panel for portable appliances.

Incidentally, as for a structure of the organic light emitting element as shown in Document 1, as a method for allowing the carrier injection barrier to be small against the organic compound film, an Mg:Ag alloy which is not only low in work function but also stable is used as a cathode, to thereby enhance an electron injection property. For this account, it has become possible to inject a large amount of carriers into the organic compound film.

Further, as for the organic compound film, recombining efficiency of the carrier has drastically been enhanced by adopting a single heterostructure such that a hole transporting layer comprising an aromatic diamine compound and an electron transporting light emitting layer comprising a tris (8-quinolinolato)-aluminum complex (hereinafter, referred to also as "Alq3") are laminated. The reason can be described below.

For example, in a case of the organic light emitting element having a single layer of Alq3, since the Alq3 has an electron transporting property, most of the electrons injected from the cathode reach the anode without being recombined with holes and the light emitting efficiency is extremely low. Namely, in order to allow the organic light emitting element having a single layer to effectively emit light (or drive it at low voltage), it is necessary to use a material which can transport both electrons and holes (hereinafter, referred to also as "bipolar material") while the Alq3 does not satisfy such conditions as described above.

However, when the single heterostructure as described in Non-Patent Document 1 is applied, the electron injected from the cathode is blocked at an interface between the hole transporting layer and the electron transporting layer, and then, confined in the electron transporting light emitting layer. Therefore, recombination of the carrier is efficiently performed in the electron transporting light emitting layer to attain an efficient light emission.

Further, it can be said that the organic light emitting element in Non-Patent Document 1 is characterized by a separation of functions such that transportation of the hole is performed in the hole transporting layer, and transportation and light emission of the electron is performed in the electron transporting layer. Such function separation concept has further been developed, and then, a technique in which three types of functions of the hole transportation, electron transportation and light emission are borne by different materials, respectively, has been proposed. By this technique, a material which has an inferior carrier transportation property but has a high light emission efficiency can be used as a light emitting material and, by adopting this material, the light emission efficiency of the organic light emitting element is enhanced.

A representative technique thereof is doping of a dye (for example, refer to Non-Patent Document 2). Namely, as shown in FIG. 3(a), in a single-hetero structure comprising the hole transporting layer 101 and the electron transporting layer 102 (also functioning as a light emitting layer), a light emission color of the dye 103 within a boundary region which is a light emitting region can be obtained by doping the dye 103 in the electron transporting layer 102. A case in which the dye 103 is doped in the hole transporting layer 101 side can also be considered.

(Non-Patent Document 2): C. W. Tang et al., Journal of Applied Physics, 1989, Vol. 65, No. 9, pp 3610–3616.

As compared to this, as shown in FIG. 3(b), there is a technique of a double heterostructure (three layer structure) in which the light emitting layer is interposed between the hole transporting layer and the electron transporting layer (for example, refer to Non-Patent Document 3). In a case of this technique, since the hole is injected from the hole transporting layer 106 to the light emitting layer 105 and the electron is injected from the electron transporting layer 107 to the light emitting layer 105, respectively, the recombination of the carrier occurs in the light emitting layer 105, and, accordingly, light emission having a light emission color of the material used as the light emitting layer 105 is attained.

(Non-Patent Document 3): Chihaya Adachi and three others, Japanese Journal of Applied Physics, 1988, Vol. 27, No. 2, L269–L271.

An advantage of such function separation as described above lies in a point that, by performing the function separation, it is not necessary to simultaneously impart one type of organic material with various functions (a light emission property, a carrier transportation property, a carrier injection property from an electrode, and the like) and, accordingly, a wide range of degree of freedom can be given to a molecular design or the like. (For example, it becomes not necessary to laboriously explore a bipolar material). Namely, a high light emission efficiency can easily be attained by combining materials each having an excellent light emission characteristics, materials each having an excellent carrier transportation property and the like in various ways.

From the aforementioned advantages, a concept of lamination structure itself (blocking function or function separation of the carrier) as described in Non-Patent Documents 1 to 3 is widely utilized.

In the organic light emitting element subjected to such function separation as described above, a technique of doping a coloring material is particularly effective in extension of a lifetime (for example, refer to Patent Document 1). As for factors thereof, mentioned are a smooth energy transfer to a host material or improvement of a film quality of the host material and the like. In Patent Document 1, rubrene is doped in the hole transporting layer, to thereby extending the lifetime of the element.

(Patent Document 1): JP-A No. 10-255985.

In Patent Document 1, since a coloring material is also doped into a hole transporting layer, a light emitting element has a structure as shown in FIG. 2 in which the coloring material is doped in each of an electron transporting layer and the hole transporting layer.

As described above, also in the element as shown in FIG. 2, a light emitting region is present in a boundary region 203 between the hole transporting layer 201 and the electron transporting layer 202. Therefore, both of two coloring materials of a first doping material and a second doping material which are present in the boundary region 203 cause light to be emitted.

In such manner as described above, when light emission occurs at a wavelength different from that at which light is intended to be emitted, a light emission color having a high purity can not be obtained. It is not favorable to use the element which emits light at such different wavelength in a full-color organic light emitting device which requires light having a high color purity in each of red, green and blue colors, respectively.

A problem of the present invention is to provide a light emitting element which can obtain light emission having a high color purity, and, at the same time, consistently emits light at the time of continuous driving, has a high resistance, has a long lifetime and is high in reliability.

SUMMARY OF THE INVENTION

A light emitting element according to the present invention, in which an organic compound film comprising a hole transporting material, an electron transporting material, a first impurity (first doping material), and a second impurity (second doping material) is provided between an anode and a cathode, is characterized in that the organic compound film is laminated with a first mixed region comprising the hole transporting material and the first impurity, a hole transporting region comprising the hole transporting material, a second mixed region comprising the electron transporting material and the second impurity, and an electron transporting region comprising the electron transporting material in the stated order from the side of the anode.

The hole transporting region means a region which does not contain any one of the doping materials and substantially comprises only the hole transporting material. Therefore, by providing the hole transporting region, it becomes possible to block an electron from being injected into the fist mixed region and, accordingly, recombination of the electron and the hole does not occur in the first mixed region comprising the first doping material. Since the recombination does not occur in the first mixed region, the first doping material does not exhibit light emission. As a result, according to the present invention, only the second doping material can emit light, and then, by using a light emitting material that is to perform light emission as the second doping material, a light emitting element which can obtain only desired light emission can be manufactured. Further, according to the present invention, a long lifetime of the organic light emitting element compared with the organic light emitting element in which the first doping material is not doped in the hole transporting material is realized and a consistent light emission can be obtained at the time of continuous driving.

Therefore, according to the present invention, the light emitting element which can obtain light emission having a high color purity and, at the same time, consistently emits light at the time of continuous driving, has a high resistance, has a long lifetime and is high in reliability can be obtained.

Further, a method for manufacturing a light emitting element according to the present invention, in which an organic compound film comprising a hole transporting material, an electron transporting material, a first impurity and a second impurity is provided between an anode and a cathode, is characterized by comprising, in the organic compound film, the steps of: forming a first mixed region comprising the hole transporting material and the first impurity adjacent to the anode; forming a hole transporting region comprising the hole transporting material adjacent to the first mixed region; forming a second mixed region comprising the electron transporting material and the second impurity adjacent to the hole transporting region; and forming an electron transporting region comprising the electron transporting material adjacent to the second mixed region.

In such structure as described above, the first impurity (first doping material) or the second impurity (second doping material) may be a coloring material.

Further, in the aforementioned structure, by providing the hole transporting region, the electron is blocked from being injected into the first mixed region, to thereby allow only the second doping material to emit light. However, when thickness of the hole transporting region is unduly small, the electron is not sufficiently blocked, passes therethrough, and then, injected to the first mixed region and, as a result, the first doping material also emits light. For this account, it is preferable that a ratio of a film thickness of the hole transporting region to a total film thickness of the mixed region and the hole transporting region is 10% or more.

Further, by doping the first impurity (first doping material) by a few percentages by weight in the hole transporting material, there is an effect of extending a lifetime compared with an element in which doping is not performed. As for the first doping material, a polycyclic compound such as rubrene is appropriate and a concentration thereof is preferably in the range of from 0.1% by weight to 10% by weight.

Therefore, an electric apparatus using a light emitting device comprising such light emitting element according to the present invention as has been described as a display portion or the like has high visibility and reliability and, accordingly, is extremely useful.

Further, the light emitting device as used herein means an image display device which uses the organic light emitting element as a light emitting element. Further, a module in which a connector, for example, an Anisotropic Conductive Film (ACF), a TAB (Tape Automated Bonding) tape or a TCP (Tape Carrier Packege) is attached to the organic light emitting element, another module in which a printed circuit board is provided at a tip of the TAB tape or the TCP, and still another module in which IC (integrated circuit) is directly mounted on the organic light emitting element by a COG (Chip on Glass) method are all included in the light emitting device.

According to the present invention, a light emitting element which can obtain light emission having a high color purity and, at the same time, consistently emits light at the time of continuous driving, has a high resistance, has a long lifetime and is high in reliability can be obtained. Therefore, an electric apparatus using a light emitting device comprising a light emitting element according to the present invention as a display portion or the like has also high visibility and reliability and, accordingly, is extremely useful.

BRIEF DESCRIPTION OF THE DRAWINGS

FIGS. 7(a)–7(b) is a top view and a cross-sectional view in Example 2;

DETAILED DESCRIPTION OF THE PRESENTLY PREFERRED EMBODIMENTS

Hereinafter, embodiments according to the present invention will be described with reference to FIG. 1.

Figure 1:
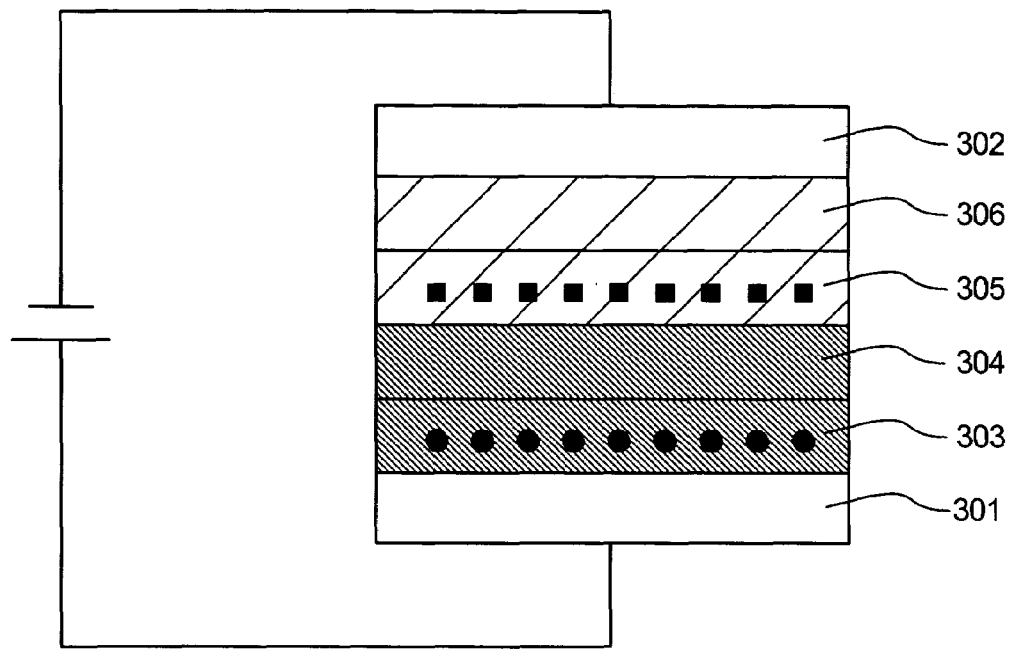
FIG. 1 is a structure of an organic light emitting element according to the present invention.
Figure 2:
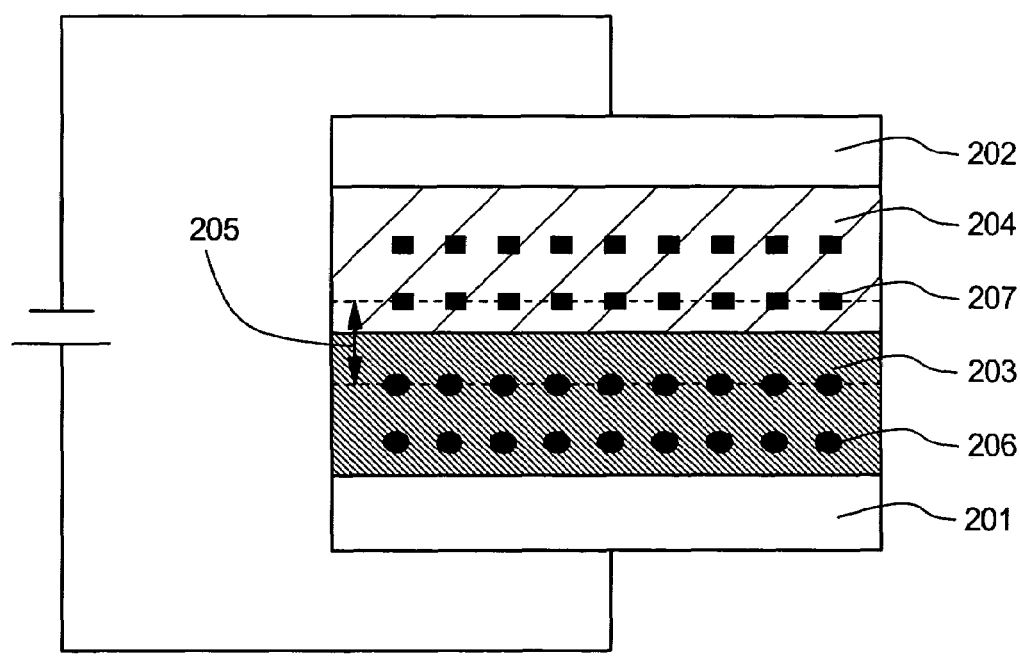
FIG. 2 is an example of a structure of an organic light emitting element in which two types of conventional dyes are doped.
Figure 3A:
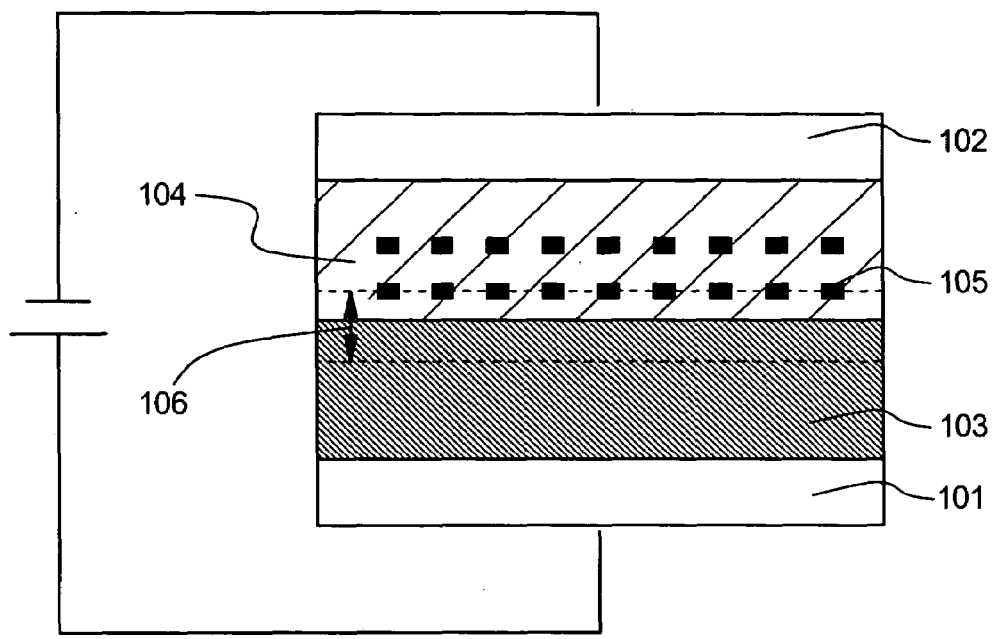
FIGS. 3(a)–3(b) are examples of structures of an organic light emitting element in which one type of a conventional dye is doped.
Figure 3B:
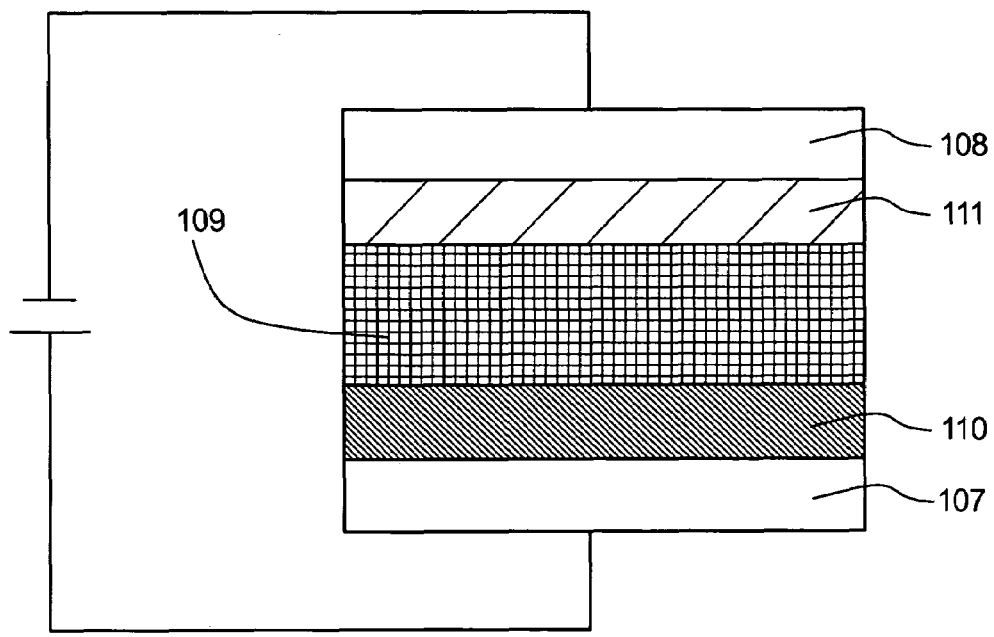

FIG. 1 is an example of a light emitting element according to the present invention. An organic compound film (electrically conductive layer) interposed between an anode 301 and a cathode 302 has a structure comprising, in a direction of from the anode 301 to the cathode 302, a first mixed region 303 comprising both a hole transporting material and a fist doping material, a hole transporting region 304 comprising only the hole transporting material, a second mixed region 305 comprising both electron transporting material and a second doping material, and an electron transporting region 306 comprising only the electron transporting material. By the structure as shown in FIG. 1, light emission is performed only at a desired wavelength and a consistent light emission can be obtained during continuous driving.

Further, in the organic light emitting element, in order to take out light emission, at least one of a first electrode and a second electrode may be transparent. As for such transparent electrode, ITO is representatively used. Still further, a material in which $SiO_2$ of from 0.1 to 10% by weight is added to ITO or another material in which ZnO of from 0.1 to 10% by weight is added to ITO may be used. The article in which $SiO_2$ of from 0.1 to 10% by weight is added to ITO can improve flatness of a surface of ITO and prevent a short-circuit between top and bottom electrodes. Although an element structure in which the first transparent electrode (anode) is formed on a substrate and light is taken out from the first electrode is ordinarily used, structures in which a cathode is formed as the first electrode and light is taken from the cathode and in which light is taken out from a reverse side opposite to the substrate are also applicable.

Light emission of the organic light emitting element to be applicable to the present invention may exhibit any light emission color. When a full-color light emission device or the like is manufactured, a plurality of light emitting elements which emit light at different center wavelengths, respectively, may be combined. Such method as described above is appropriate for being applied by the present invention. Further, a method in which a color filter is combined with the organic light emitting element which exhibits a white light emission color, another method in which a color conversion layer is combined with the organic light emitting element which exhibits a blue light emission color or the like may be used. Particularly, the present invention is preferably applied to a method in which three primary colors (blue, red and green) are combined together.

Further, a structure in which a hole injection layer comprising a hole injecting material is formed between the anode and the first mixed region, or an electron injection layer comprising an electron injecting material is formed between the cathode and the second mixed region is permissible.

Next, favorable materials for the hole injecting material, the hole transporting material, the electron transporting material, the electron injecting material, the light emitting material and the like are described below. However, the materials for use in the light emitting element according to the present invention are not limited thereto.

As for the hole injecting material, when it is an organic compound, a porphyrin-type compound is effective. Examples of such compounds include phthalocyanine and copper phthalocyanine (hereinafter, referred to also as "CuPc"). When it is a polymeric compound, polyvinyl carbazole and the like can be mentioned. However, as described previously, there is a material in which a chemical doping is performed on a conjugated electrically conductive polymeric compound and, on this connection, polyethylene dioxythiophene in which polystyrene sulfonic acid is doped, polyaniline in which a Lewis acid of iodine or the like is-doped, polypyrrole or the like is mentioned. Further, an insulator of polymeric compound is so effective on a point of flattening the anode that polyimide is mentioned. Still further, an inorganic compound is also used and, on this connection, not only a thin metallic film of, for example, gold or platinum but also an ultra-thin film of aluminum oxide or the like is mentioned.

A material that is most widely used as the hole transporting material is an aromatic amine-type (namely, having a benzene-nitrogen bond) compound. Examples of such materials as widely used include 4,4'-bis-(diphenylamino)-biphenyl; derivatives thereof such as 4,4'-bis-[N-(3-methylphenyl)-N-phenyl-amino]-biphenyl and 4,4'-bis-[N-(1-naphthyl)-N-phenyl-amino]-biphenyl (hereinafter, referred also as "α-NPD" for short); and star burst aromatic amine compounds such as 4,4',4"-tris (N,N-diphenyl-amino)-triphenyl amine and 4,4',4"-tris [N-(3-methylphenyl)-N-phenyl-amino]-triphenyl amine.

As for the electron transporting material, a metal complex is often used. Examples of such electron transporting materials include metal complexes each having a quinoline skeleton or a benzoquinoline skeleton, such as Alq3 as previously described, tris(4-methyl-8-quinolinolato)aluminum (hereinafter referred to also as "Almq'"), and bis(10-hydroxybenzo[h]-quinolinato)beryllium (hereinafter referred to also as "Bebq"); and mixed ligand complexes such as bis(2-methyl-8-quinolinolato)-(4-hydroxy-biphenylyl)-aluminum (hereinafter referred to also as "BAlq3"). Examples of these materials also include metal complexes each having an oxazole-based or thiazole-based ligand such as bis[2-(2-hydroxypheyl)-benzoxazolato]zinc (hereinafter referred to also as "Zn(BOX)$_2$") and bis[2-(2-hydroxypheyl)-benzothiazolato]zinc (hereinafter referred to also as "Zn(BZT)$_2$"). Other than these metal complexes, oxadiazole derivatives such as 2-(4-biphenylyl)-5-(4-tert-butylphenyl)-1,3,4-oxadiazole and 1,3-bis[5-(p-tert-butylphenyl)-1,3,4-oxadiazole-2-yl]benzene; triazole derivatives such as 3-(4-tert-butylphenyl)-4-phenyl-5-(4-biphenylyl)1,2,4-triazole and 3-(4-tert-butylphenyl)-4-(4-ethylpheyl)-5-(4-biphenylyl)-1,2,4-triazole; and phenanthroline derivatives such as bathophenanthroline and bathocuproine each have an electron transporting property.

As for the electron injecting material, any one of the aforementioned electron transporting materials can be used. Other than these materials, an insulating ultra-thin film of alkaline metal halides such as lithium fluoride and alkaline metal oxides such as lithium oxide are often used. Further, alkaline metal complexes such as lithium acetylacetonate and 8-quinolinolato-lithium are also effective.

As for the light emitting material, not only metal complexes such as Alq3, Almq, BeBq, BAlq, ZN(BOX)$_2$, and ZN(BTZ)$_2$, but also various types of fluorescent dye to be used as the second doping material are effective. As for fluorescent dyes, quinacridone derivatives such as green-colored quinacridon, 2,9-dimethylquinacridon, benzo-[h]-benzo-[7,8]-quino-[2,3-b]-acridine-7,16-dimethyl-9,18-dihydro (hereinafter referred to also as "DMNQA"), blue-colored perylene, reddish orange-colored 4-(dicyanomethylene)-2-methyl-6-(p-dimethylaminostyryl)-4H-pyran are mentioned. Further, triplet light-emitting materials are also possible and a complex having platinum or iridium as a center metal is used mainly. As for the triplet light-emitting materials, tris(2-phenylpyridine)iridium, 2,3,7,8,12,13,17,18-octaethyl-21H, 23H-porphyrin-platinum and the like are mentioned.

As for the first doping material that is doped in the hole transporting layer, a polycyclic compound such as rubrene-type is used. Particularly, rubrene is used as a favorable material. Further, TBT (tert-butyl perylene) or DDPA (9,10-di(3,5-diphenyl) anthratene can be used.

Materials having respective functions as described above are combined in various ways, and then, by applying any one of the resultant combination to the light emitting element according to the present invention, an organic light emitting element which can obtain light emission at a desired wavelength and has a long lifetime can be manufactured.

The present invention having the aforementioned structure will be explained in more detail in embodiments to be described below.

EMBODIMENTS

EXAMPLE 1

Figure 4:
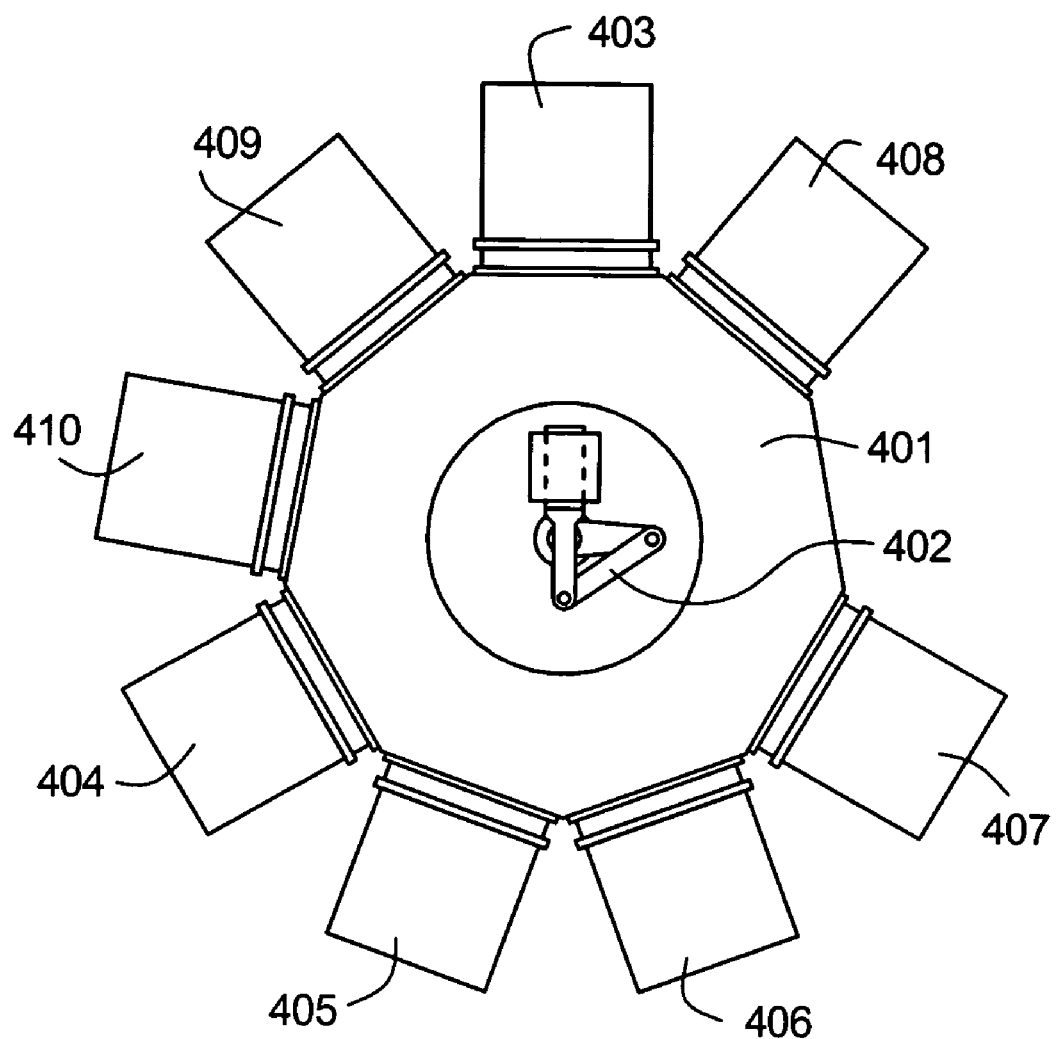
FIG. 4 is a diagram of an vapor deposition device to be used for manufacturing an element in Example 1.

In the present embodiment, a method for manufacturing, by using a vapor deposition device as shown in FIG. 4, an organic compound film and a second electrode (cathode) on a substrate on which a transparent electrode such as ITO has previously been prepared is shown.

The vapor deposition device as shown in FIG. 4 comprises a transport chamber 401 (attached with a transport robot 402 for use in transporting a substrate, a counter substrate or metal mask), a substrate/mask stock chamber 403 connected to the transport chamber 401, a pretreatment chamber 404, a first organic vapor deposition chamber 405, a second organic vapor deposition chamber 406, a metal vapor deposition chamber 407, a CVD chamber 408, a sealing glass stock chamber 409 and a sealing chamber 410.

Firstly, loading of a substrate and a metal mask for vapor deposition is performed in the substrate/mask stock chamber. The substrate/mask stock chamber is constituted such that it has an elevator structure (in the present embodiment, having 11 steps) and allows each step to be serviceable for both the substrate (in the present embodiment, being set as 126.6 mm×126.6 mm) and the mask. It has a maximum loading capacity of ten pieces of the substrate and the mask in total. Since remaining one step functions as a substrate heating step for heating the substrate, it is allowed to be empty when the substrate or the mask is loaded. Further, in the manufacturing device in the present embodiment, a direction of the substrate is set to be facedown at all times.

Next, loading of a counter substrate is performed in a sealing glass stock chamber. The sealing glass stock chamber is constituted such that it has an elevator structure (in the present embodiment, having ten steps) and allows each step to have a maximum loading capacity of ten pieces of pretreated (representatively, denoting being subjected to treatments of attaching a desiccant for absorbing moisture inside and outside of a panel and applying a sealant for bonding with the substrate) counter substrates (in the present embodiment, being set as 126.6 mm×126.6 mm each). Further, in the manufacturing device according to the present invention, a direction of the counter substrate is set to be face up at all times.

In the manufacturing device according to the present invention, a film-forming treatment is completed prior to other treatments on all of loaded substrates. This is called as a "vapor deposition mode". After the vapor deposition mode is completed, the procedure proceeds to a "sealing mode" in which bonding of the counter substrate is performed.

Hereinafter, taking, for example, the case where seven substrates and three masks are used, the vapor deposition mode is described.

Firstly, the transport chamber is evacuated to be in a high vacuum. During the vapor deposition, the transport chamber is maintained to be in a high vacuum. Next, after the substrate/mask stock chamber is evacuated, the masks are transported into the first organic vapor deposition chamber, the second organic vapor deposition chamber, and the metal vapor deposition chamber, respectively. In the present manufacturing device, there are three film-forming chambers which each use the mask. After preparations as described above are completed, the substrate is transported into the pretreatment chamber. In the pretreatment chamber, heating of the substrate in a vacuum and a plasma treatment by using a single gas system (for example, O2 plasma treatment) are both possible and such treatments as described above are performed on an entire surface of the substrate.

Further, since it is possible to perform the heating of the substrate on a substrate heating step in the mask stock chamber, the heating of the substrate may be performed there in order to aim at a throughput improvement. In the present embodiment, vacuum heating of the substrate is performed in the substrate/mask stock chamber after evacuated. Namely, the substrate is transported from the substrate/mask stock chamber onto the substrate heating step in the substrate/mask stock chamber via the transport chamber, and then, heating is performed by a heater. After the heating is completed, the substrate is transported into the pretreatment chamber via the transport chamber, and then, cooled (namely, left to stand in the pretreatment chamber). By such arrangement as described above, even in period in which the substrate is being cooled, it becomes possible to heat a next substrate in a vacuum in the substrate/mask stock chamber, to thereby improve the throughput.

Next, the substrate is transported from the pretreatment chamber to the second organic vapor deposition chamber via the transport chamber, and then, after the substrate is subjected to an alignment with a mask by using two CCD cameras, 20 nm of a hole injecting layer CuPc is formed thereon. In the second organic vapor deposition chamber, a material is allowed to be evaporated from fixed vapor deposition sources (in the present embodiment, being set as eight sources), and then, a film thereof is formed on a substrate located over. The substrate is rotated while the vapor deposition is performed. By such rotation, a thickness distribution within a surface of the film on the substrate is improved. After the CuPc is formed, the hole transporting layer is formed. Firstly, 20 nm of a mixed region in which 5% by weight of rubrene is doped in an α-NPD is formed by a co-vapor deposition method. After the mixed region of the α-NPD and the rubrene is formed, 20 nm of non-doped layer that is constituted only by the α-NPD is continuously formed only by closing the vapor deposition source attached to the rubrene vapor deposition source.

Next, the substrate is transported to the first organic vapor deposition chamber via the transport chamber. A mechanism and a film-forming treatment method are completely same as those in the second organic vapor deposition chamber except that there are six vapor deposition sources. Here, Alq3 which simultaneously acts as the light emitting layer and the electron transporting layer is formed. Particularly, a minute amount (for example, about 0.5% by weight) of DMNQA is doped in the light emitting layer by the co-vapor deposition method. By such doping, a panel lifetime of a completed panel is substantially improved. Further, shifting from the light emitting layer to the electron transporting layer is smoothly conducted only by closing a vapor deposition source shutter attached to a DMNQA vapor deposition source. By such method as described above, 37.5 nm of the light emitting layer and 37.5 nm of the electron transporting layer are formed.

Next, the substrate is transported into the metal vapor deposition chamber via the transport chamber. In this chamber, 1 nm of the electron injecting layer CaF2 and 200 nm of the cathode Al are formed. In the metal vapor deposition chamber, film-forming can be performed by using a resistive heating method (12 positions of resistive heating vapor deposition sources in total (six-position system×2) exist), an EB method (six positions of EB vapor deposition sources in total (six-position system×1) exist); however, when a damage to the TFT on the substrate is taken into consideration, it is desirable to use the resistive heating method. A mechanism and a film-forming treatment method are completely same as those in the first and second organic vapor deposition chambers except for vapor deposition sources.

Further, in the CVD chamber, it is possible to form a CVD film on an entire surface of the substrate. Still further, it is also possible to perform a plasma treatment by using plural types of gases. By making use of this, for example, a silicon nitride film may be formed on a cathode Al as a protective film or a plasma treatment by using plural types of gases (for example, Ar+$O_2$ plasma treatment) may be performed on the substrate.

The substrate that has been subjected to necessary treatments as described above is back to the substrate/mask stock chamber at a starting point via the transport chamber. Further, a series of treatments necessary for obtaining a single-colored panel of green-colored light emission has been described; however, the present invention is not limited thereto.

When same treatments as described above are completed on all of the loaded substrates and recovered from each vapor deposition chamber to the substrate/mask stock chamber, the vapor deposition is completed, and then, the present manufacturing device subsequently enters into the sealing mode.

Further, in the aforementioned description, raised is a case in which three masks to be used are set in the vapor deposition chamber in advance and they are not changed during the vapor deposition treatment, namely, a case of "no mask change mode". However, depending on an element structure, it goes without saying that a request for using a plurality of masks every vapor deposition chamber appears. Even in such case, the present manufacturing device can correspond to this request and three or more masks are set in the substrate/mask stock chamber in advance, and then, masks may be changed in an interval between treatments in the vapor deposition chamber (however, as the number of the masks to be used is increased, the number of the substrates to be treated at the same time is of course decreased. This is called as "mask-change mode" and is separated from the aforementioned mode.

The sealing mode is now described below.

Firstly, it is necessary to allow the transport chamber, the substrate/mask stock chamber, the sealing glass stock chamber back to be in a normal pressure. As for the transport chamber and the substrate/mask stock chamber, immediately after the vapor deposition mode is completed, a vent treatment may be performed. The vent treatment denotes a treatment of injecting a gas into a chamber which has been evacuated to be in a low pressure and recovering the chamber to be in a normal pressure. In the present embodiment, nitrogen is used as a gas to be injected for the paint treatment. As for the sealed glass stock chamber, by setting the counter substrate which has been subjected to the pretreatment immediately before the sealing as far as possible, deterioration of a sealant or desiccant can be prevented. After the counter substrate is set, by performing evaluation and the vent treatment on the sealing glass stock chamber several times (in the present embodiment, being set as two times), not only reduction of moisture content in the transport chamber at the time of the sealing mode can be prevented, but also defoaming of the sealant applied on the counter substrate can be performed. It is ideal that, immediately after the last vent treatment in the sealing glass stock chamber is completed, the sealing treatment is started. This can be realized by properly setting, by an operator, a timing of each of the vent treatment in the transport chamber and the substrate/mask stock chamber, the loading of the counter substrate in to the sealing glass stock chamber, and the vent treatment in the sealing glass stock chamber.

Next, the substrate is transported from the substrate/mask stock chamber to the sealing chamber via the transport chamber, while the counter substrate is transported from the sealing glass stock chamber to the sealing chamber via the transport chamber. In the sealing chamber, after an alignment (position alignment) between the substrate and the counter substrate is completed such that positions of both peripheral end faces are aligned each other, the substrate and the counter substrate are bonded with each other, and sealed by putting pressure. Further, a UV irradiation is performed from the side of the counter substrate (lower side), to thereby cure the sealant (in the present embodiment, being set as a UV-curable resin). On this occasion, it is possible to use a shielding mask and to selectively perform the UV irradiation only on a sealant portion. Still further, in the present embodiment, the shielding mask is an article in which a Cr film is formed on quartz glass and, since it is impossible to transport it into the transport chamber by a transport robot, the operator directly sets it in the sealing chamber.

By performing such sealing treatment as described above, the substrate and the counter substrate are combined with each other to be a panel in a unit. The resultant panel is transported from the sealing chamber to the substrate/mask stock chamber via the transport chamber. Subsequently, next substrate and counter substrate are subjected to same treatments as those described above. In the end, seven panels are stocked in the substrate/mask stock chamber and the sealing mode is terminated.

After the sealing mode is completed, the panel may be taken out of the substrate/mask stock chamber.

A series of treatments in the vapor deposition mode and the sealing mode can automatically be performed by using a control system. When information including a transport route, treatment details and the like every substrate are registered, by only sending a signal of starting the treatment, a series of treatments are automatically performed on each substrate in accordance with the registered information.

COMPARATIVE EXAMPLE 1

A light emitting element was manufactured in a same manner as in Example 1 except that, in forming a hole transporting layer, 40 nm of a layer in which 5% by weight of rubrene was doped in an α-NPD was formed by a co-vapor deposition method without forming a non-doped layer.

Figure 5:
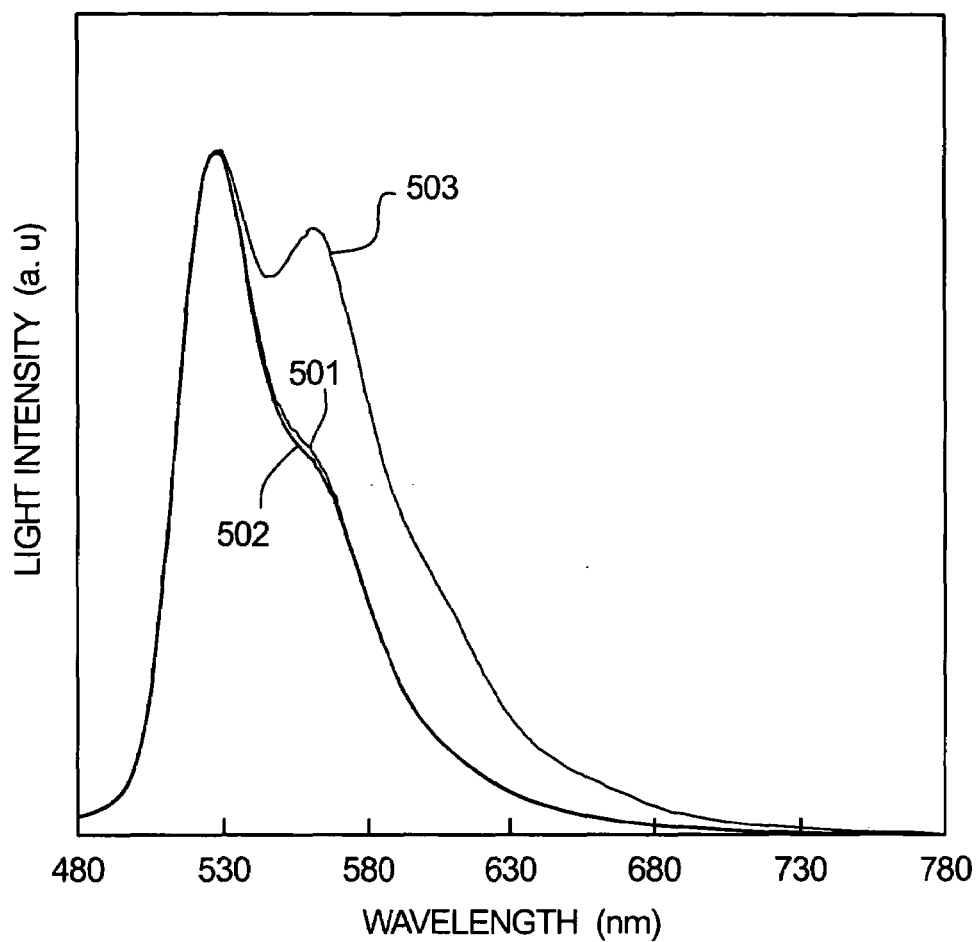
FIG. 5 shows EL spectra in light emitting elements for the purpose of comparing the light emitting element according to the present invention with a conventional one.

In regard to the elements manufactured in Example 1 and Comparative Example 1, EL spectra at the time of 125 mA/m$^2$ of current density are shown in FIG. 5. As for the EL spectra, light emission from the side of the substrate was measured on each element. In the light emitting element manufactured by a method in Example 1, spectrum 501 caused by DMNQA which was doped in an electron transporting layer was observed. However, in the light emitting element manufactured by a method in Comparative Example 1, not only light emission of DMNQA but also spectrum 503 which contains a peak caused by rubrene doped in the hole transporting layer was observed.

In such a manner as described above, the light emitting element manufactured in Comparative Example 1 exhibits light emission of two types of materials, while that manufactured in Example 1 exhibits light emission of one type of material. Therefore, in order to obtain a light emission color having a high purity only at a desired wavelength, it was confirmed that it is desirable to use the element manufactured in Example 1.

COMPARATIVE EXAMPLE 2

A light emitting element was manufactured in a same manner as in Example 1 except that, in forming a hole transporting layer, 40 nm of only α-NPD was formed without forming a mixed region.

In regard to the elements manufactured in Example 1 and Comparative Example 2, EL spectra at the time of 125 mA/m$^2$ of current density are shown in FIG. 5. As for the EL spectra, light emission from the side of the substrate was measured on each element. In the light emitting elements manufactured by a method in Example 1 and a method in Comparative Example 2, spectra 501 and 502 caused by DMNQA which was doped in an electron transporting layer were observed.

Figure 6:
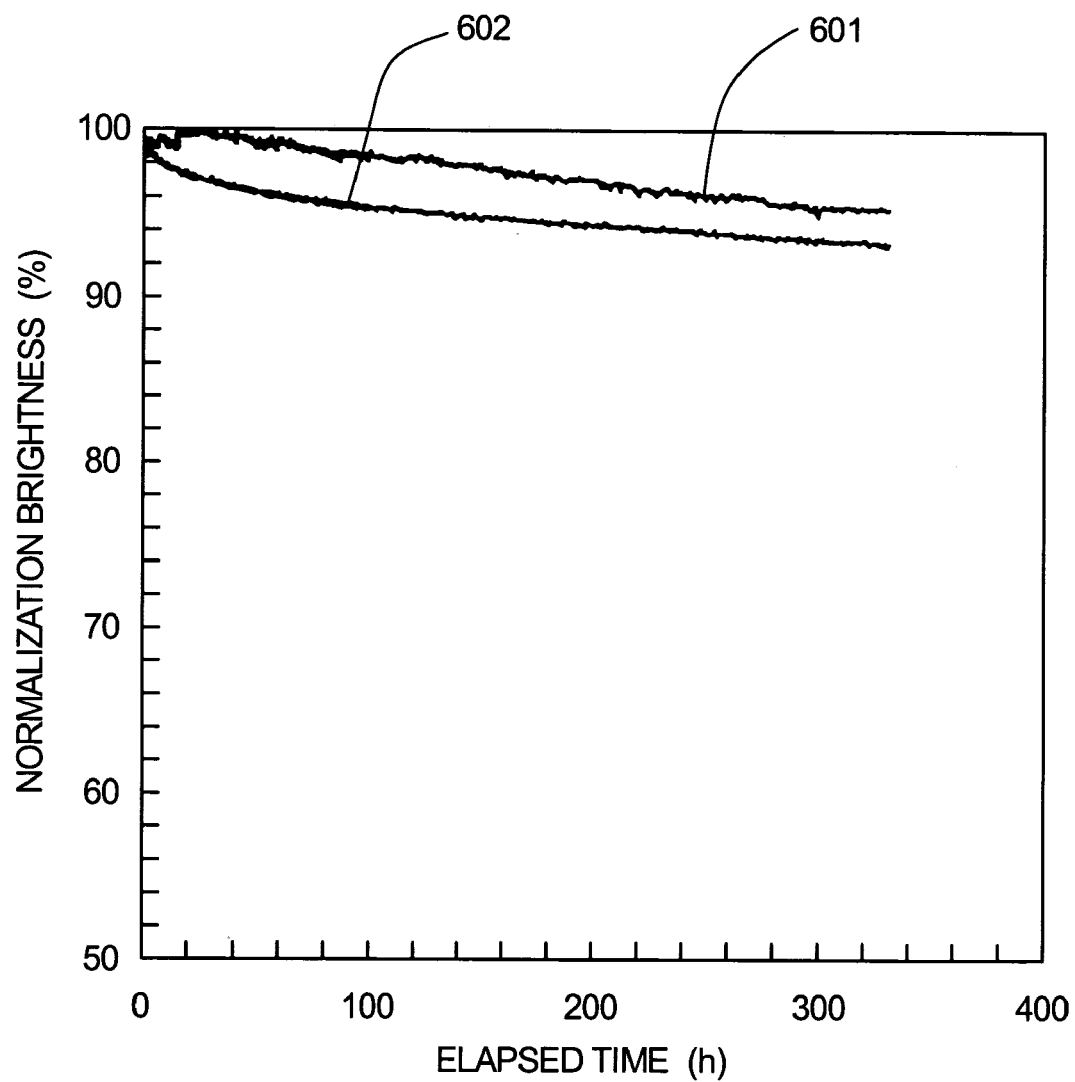
FIG. 6 is a graph showing a relation between a constant current driving time and a normalization brightness of a light emitting element for the purpose of comparing the light emitting element according to the present invention with a conventional one.

Further, in regard to light emitting elements manufactured in Example 1 and in Comparative Example 2, brightness deterioration against the elapsed time at the time the elements were subjected to a constant current driving with a current value which allows an initial brightness to be 1000 cd/m$^2$ is shown in FIG. 6.

When a time-brightness curve 601 of the light emitting element manufactured in Example 1 and a time-brightness curve 602 of the light emitting element manufactured in Comparative Example 2 were compared with each other, the light emitting element manufactured in Example 1 showed a slow brightness deterioration against the elapsed time compared with the other one.

Therefore, it was confirmed that the light emitting element manufactured in Example 1 according to the present invention can obtain a light emission color having a high purity and can be a light emitting element having a long lifetime.

EXAMPLE 2

In the present embodiment, a light emitting device having an electric field light emitting element according to the present invention in a pixel portion is described with reference to FIG. 7. Further, FIG. 7(a) is a top plan view showing a light emitting device, while FIG. 7(b) is a cross-sectional view taken along the line B–B' of FIG. 7(a). As shown by dotted lines, 701 denotes a driver circuit (source side driver circuit) portion; 702 denotes a pixel portion; and 703 denotes a driver circuit (gate side driver circuit) portion.

Further, 704 denotes a sealing substrate; 705 denotes a sealant; and an inside 707 surrounded by the sealant 705 is a space.

Further, 708 denotes a wiring for transmitting signals to be inputted in the source side driver circuit portion 701 and the gate side driver circuit portion 703 and receives signals such as a video signal, a clock signal, a start signal and a reset signal from an FPC 709 which becomes a an outer input terminal. Furthermore, on this occasion, although only the FPC is shown, a printed wiring board (hereinafter, referred to also as "PWB") may be attached thereto. In the light emitting device as described herein, not only a main body of the light emitting device, but also that attached with the FPC or the PWB is included.

Next, a cross-sectional structure thereof is described with reference to FIG. 7(*b*). On an element substrate 710, the driver circuit portion and the pixel portion are formed. On this occasion, the source side driver circuit 701 which is the driver circuit portion and the pixel portion 702 are shown.

Further, in the source side driver circuit 701, a CMOS circuit in which an n channel-type TFT 723 and a p channel-type TFT 724 are combined with each other is formed. Still further, the TFT which forms the driver circuit may be formed by a known CMOS circuit, a PMOS circuit, or an NMOS circuit. Furthermore, in the embodiments according to the present invention, although a driver integrated type in which the driver circuit is formed on the substrate is shown, such structure is not always required and the driver circuit may not be formed on the substrate and may be formed outside the substrate.

Further, the pixel portion 702 is formed by a plurality of pixels containing a switching TFI 711, a current control TFT 712 and a first electrode 713 electrically connected to a drain thereof. Still further, an insulator 714 is formed such that it covers an end portion of the first electrode 713 and, on this occasion, it is formed by using a positive-type photosensitive acrylic resin film.

Further, in order to secure coverage, a curved face having a curvature is allowed to be formed in a top end portion or a bottom end portion of the insulator 714. For example, when the positive-type photosensitive acrylic resin is used as a material of the insulator 714, it is preferable to form a curved face having a curvature radius (0.2 μm to 3 μm) only on the top end portion of the insulator 714. Still further, as for the insulator 714, any one of a negative type one which becomes insoluble to an etchant by photosensitive light and a positive type one which becomes soluble to the etchant by photosensitive light can be used.

On the first electrode 713, an organic compound layer 716 and a second electrode 717 are each formed. On this occasion, as for a material of the first electrode 713 which functions as an anode, it is desirable that a material having a large work function is used. For example, a single layer film such as an ITO film, an indium zinc oxide film, a titanium nitride film, a chromium film, a tungsten film, a Zn film, a Pt film; a laminated layer of titanium nitride and a film comprising, aluminum as a main component; a three-layer structure of a titanium nitride film, a film comprising, as a main component, aluminum and a titanium nitride; or the like can be used. Further, when it takes a laminate structure, it is low in resistance as wiring, it can obtain a favorable ohmic contact and, moreover, it can function as an anode.

Further, the organic compound layer 716 uses the structure in any one of embodiments or in Example 1 according to the present invention. For details, the embodiments and Example 1 may be referred.

Further, as for the material to be used in the second electrode (cathode) 717 to be formed on the organic compound layer 716, a material having a small work function (Al, Ag, Li, Ca, or alloys thereof such as MgAg, MgIn, AlLi, $CaF_2$ or CaN) may be used. Still further, when light generated in the electric field light emission layer 716 is allowed to pass through the second electrode 717, as for the second electrode (cathode) 717, a laminated layer of a metallic thin film with a reduced film thickness and a transparent electrically conductive film (ITO, an alloy of indium oxide and zinc oxide, zinc oxide or the like) may be used.

Further, by bonding the sealing substrate 704 with the element substrate 710 by the sealant 705, a structure in which an organic light emitting element 718 is provided in the space 707 which is surrounded by the element substrate 701, the sealing substrate 704 and the sealant 705 is constructed. Still further, another structure in which an inert gas (nitrogen, argon or the like) is filled, or the sealant 705 is filled in the space 707 is also included.

Further, it is preferable that an epoxy resin is used as the sealant 705. Still further, such materials as described above do not allow moisture or oxygen to permeate them as much as possible are desirable. Furthermore, as for the material to be used in the sealing substrate 704, not only a glass substrate and a quartz substrate, but also a plastic substrate comprising a polyimide, a polyamide, an acrylic resin, an epoxy resin, PES, PC, PET, PEN or the like can be used.

In such a manner as described above, the light emission device having the organic light emitting element according to the present invention can be obtained.

EXAMPLE 3

The light emitting device according to the present invention as has been described above has advantages in that a light emission color is high in purity and it has a long lifetime. Therefore, electric apparatuses each having the aforementioned light emitting device as a display portion are high in visibility and reliability and, accordingly, are extremely useful.

By using the light emitting device comprising the light emitting element manufactured in accordance with the present invention, various types of modules (active matrix type liquid crystal module, active matrix type EL module and active matrix type EC module) can be manufactured and, moreover, electronic apparatuses in which any one of these modules is mounted can be manufactured.

Examples of such electronic apparatuses include a video camera, a digital camera, a head mount display (goggle-type display), a car navigation system, a projector, a car stereo, a personal computer and a portable information terminal (such as mobile computer, cellular telephone or electronic book). Examples of these appliances are shown in FIGS. 8 and 9.

Figure 8A:
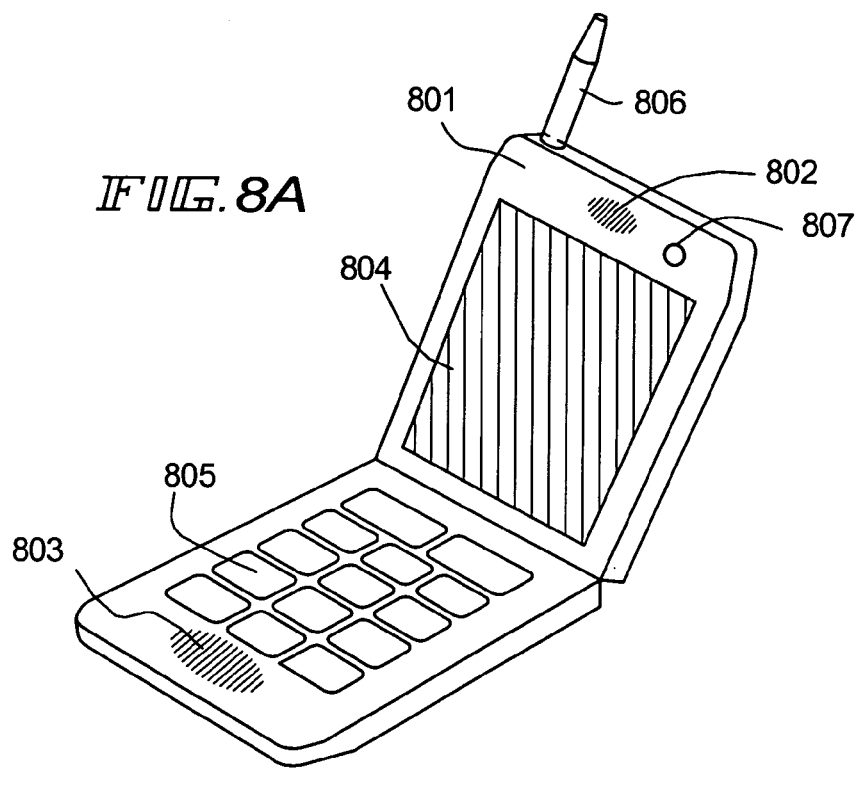
FIGS. 8(A)–8(C) is a diagram showing examples of electronic apparatuses (Example 3)

FIG. 8(A) shows the cellular telephone comprising a main body 801, a sound output portion 802, a sound input portion 803, a display portion 804, an operation switch 805, an antenna 806, an image input portion (CCD, image sensor or the like) 807 and the like. By manufacturing the cellular telephone in which the light emitting device comprising the light emitting element according to the present invention is used in the display portion 804, the cellular telephone having a high visibility and a high reliability can be realized.

Figure 8B:
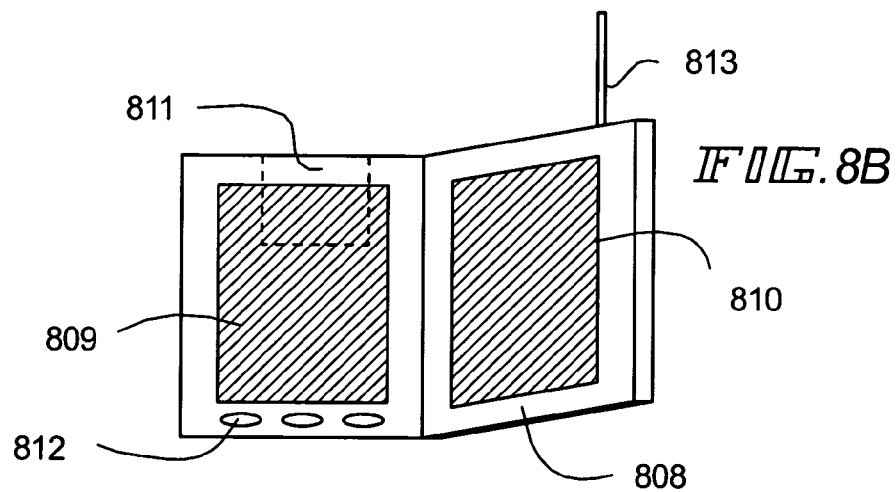

FIG. 8(B) shows a portable book (electronic book) comprising a main body 808, display portions 809 and 810, a memory medium 811, an operation switch 812, an antenna 813 and the like. By manufacturing the portable book (electronic book) in which the light emitting device comprising the light emitting element according to the present invention is used in the display portion 809, the portable book (electronic book) having a high visibility and a high reliability can be realized.

Figure 8C:
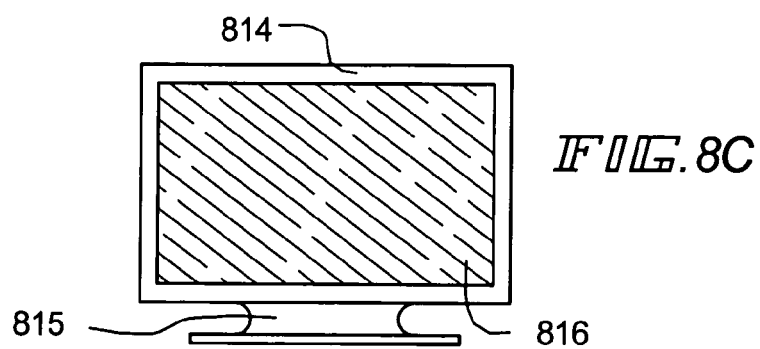

FIG. 8(C) shows a display comprising a main body 814, a support base 815, a display portion 816 and the like. By manufacturing the display in which the light emitting device comprising the light emitting element according to the present invention is used in the display portion 816, the display having a high visibility and a high reliability can be realized.

Note that, the display shown in FIG. 8(C) is that of a small- to medium-sized type or a large-sized type, for example, having a screen size of 5 to 20 inches. Moreover, it is preferable to perform a mass-production by executing a multiple pattern using a substrate having a side of 1 m to form the display portion of such size as described above.

Figure 9A:
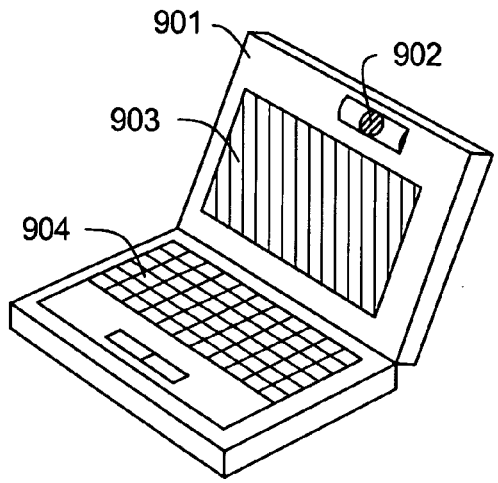
FIGS. 9(a)–9(e) is a diagram showing an examples of electronic apparatuses (Example 3).

FIG. 9(A) shows a personal computer comprising a main body 901, an image input portion 902, a display portion 903, a keyboard 904 and the like. By manufacturing the personal computer in which the light emitting device comprising the light emitting element according to the present invention is used in the display portion 903, the personal computer having a high visibility and a high reliability can be realized.

Figure 9B:
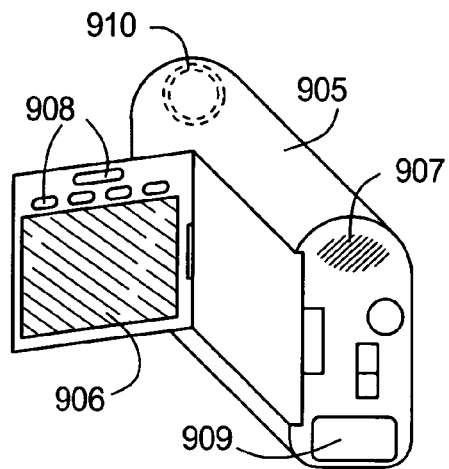

FIG. 9(B) shows a video camera comprising a main body 905, a display portion 906, a sound input portion 907, an operation switch 908, a battery 909, an image receiving portion 910 and the like. By manufacturing the video camera in which the light emitting device comprising the light emitting element according to the present invention is used in the display portion 906, the video camera having a high visibility and a high reliability can be realized.

Figure 9C:
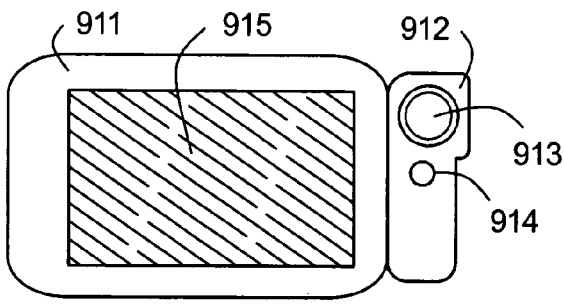

FIG. 9(C) shows a mobile computer comprising a main body 911, a camera portion 912, an image receiving portion 913, an operation switch 914, a display portion 915 and the like. By manufacturing the mobile computer in which the light emitting device comprising the light emitting element according to the present invention is used in the display portion 915, the mobile computer having a high visibility and a high reliability can be realized.

Figure 9D:
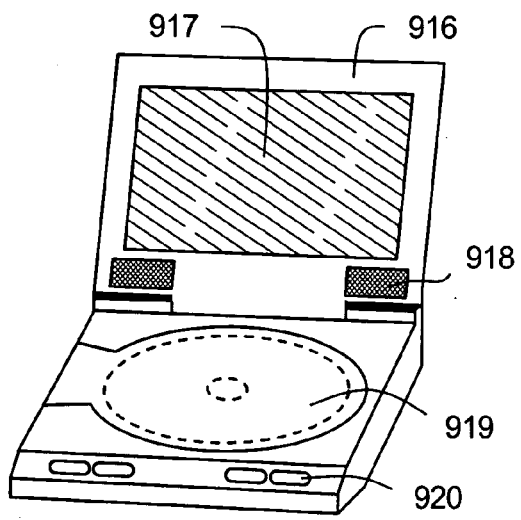

FIG. 9(D) shows a player using a record medium recorded with a program (hereinafter, referred to also as record medium) comprising a main body 916, a display portion 917, a speaker portion 918, a record medium 919, an operation switch 920 and the like. Moreover, the player uses DVD (Digital Versatile Disc), CD and the like as the record medium and can enjoy music, enjoy movie, play a game, and be on the Internet. By manufacturing the player in which the light emitting device comprising the light emitting element according to the present invention is used in the display portion 917, the player having a high visibility and a high reliability can be realized.

Figure 9E:
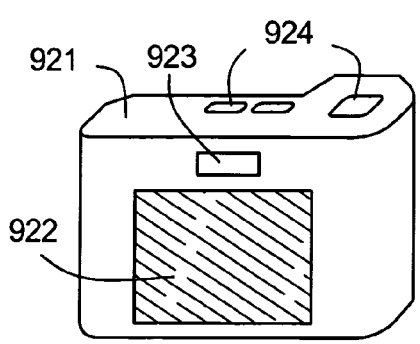

FIG. 9(E) shows a digital camera comprising a main body 921, a display portion 922, an eye piece portion 923, an operation switch 924, an image receiving portion (not shown) and the like. By manufacturing the digital camera in which the light emitting device comprising the light emitting element according to the present invention is used in the display portion 922, the digital camera having a high visibility and a high reliability can be realized.

As has been described above, the range of applications of the present invention is extremely wide and the present invention is applicable to manufacturing methods of electronic apparatuses in various fields. Further, the electronic apparatuses described in the present embodiment according to the present invention can be realized by structures of any combinations of embodiments and Examples 1 and 2.

The invention claimed is:

1. A light emitting element comprising: an organic compound film comprising a hole transporting material, an electron transporting material, a first impurity, and a second impurity is provided between an anode and a cathode, wherein the organic compound film is laminated with a first mixed region comprising the hole transporting material and the first impurity, a hole transporting region comprising the hole transporting material, a second mixed region comprising the electron transporting material and the second impurity, and an electron transporting region comprising the electron transporting material in order from a side of the anode.

2. A light emitting element, according to claim 1, wherein the first impurity and the second impurity comprise a coloring material.

3. A light emitting element, according to claim 1, wherein a ratio of a film thickness of the hole transporting region to a total film thickness of the first mixed region and the hole transporting region is 10% or more.

4. A light emitting element, according to claim 1, wherein a concentration of the first impurity in the first mix region is in the range of from 0.1% by weight to 10% by weight.

5. A light emitting element, according to claim 1, wherein the light emitting element is mounted in an electronic apparatus selected from the group consisting of a video camera, a digital camera, a head mount display, a car navigation system, a projector, a personal computer, and a portable information terminal.

* * * * *